United States Patent
Watt

(10) Patent No.: US 7,917,883 B2
(45) Date of Patent: Mar. 29, 2011

(54) METHOD FOR INCORPORATING PATTERN DEPENDENT EFFECTS IN CIRCUIT SIMULATIONS

(75) Inventor: Jeffrey Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 74 days.

(21) Appl. No.: 11/043,609

(22) Filed: Jan. 24, 2005

(65) Prior Publication Data

US 2006/0190854 A1    Aug. 24, 2006

(51) Int. Cl.
*G06F 17/50*    (2006.01)
(52) U.S. Cl. ........................................ 716/136
(58) Field of Classification Search .................. 716/4–5, 716/11, 136
See application file for complete search history.

(56) References Cited

U.S. PATENT DOCUMENTS

| | | | |
|---|---|---|---|
| 6,425,117 B1 * | 7/2002 | Pasch et al. .................... 716/21 |
| 6,898,561 B1 * | 5/2005 | Liu et al. ......................... 703/14 |
| 6,978,229 B1 * | 12/2005 | Saxena et al. .................... 703/4 |
| 2004/0044511 A1 * | 3/2004 | Sekido et al. .................. 703/14 |
| 2004/0153986 A1 * | 8/2004 | Sahara et al. .................. 716/10 |
| 2005/0076316 A1 * | 4/2005 | Pierrat et al. .................... 716/4 |
| 2005/0216873 A1 * | 9/2005 | Singh et al. ...................... 716/5 |

* cited by examiner

*Primary Examiner* — Jack Chiang
*Assistant Examiner* — Suresh Memula
(74) *Attorney, Agent, or Firm* — Ropes & Gray LLP

(57) ABSTRACT

Methods, software, and apparatus for providing a netlist for simulation that includes one or more parameters that are determined by one or more pattern dependent effects. One particular embodiment of the present invention receives a layout of a circuit including one or more MOSFET transistors. For one or more of the MOSFET transistors, spacing between transistors is measured using the received layout and a pattern dependent parameter is determined. This parameter modifies the length of the gate that is used in simulation. In other embodiments, other pattern dependent effects can be used to determine the values of one or more parameters. These parameters may be used to modify gate length, emitter size, resistor width, or other device characteristics.

30 Claims, 10 Drawing Sheets

```
                                                    450
M1  N2  N3  G1  N1  B  NCH  W=Wdr  L=Ldr
M2  N3  N4  G1  N2  B  NCH  W=Wdr  L=Ldr
M3  N4  G1  N3  B  NCH  W=Wdr  L=Ldr
M4  N6  G2  N5  B  NCH  W=Wdr  L=Ldr
```

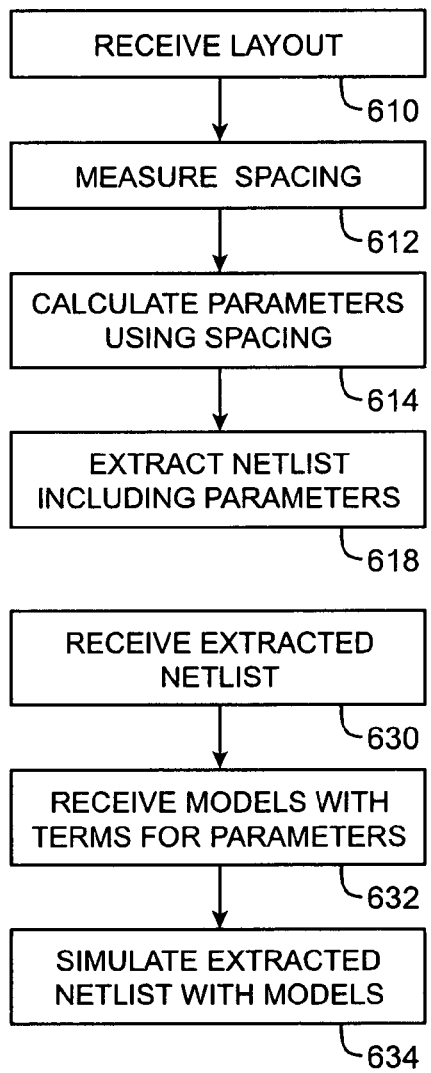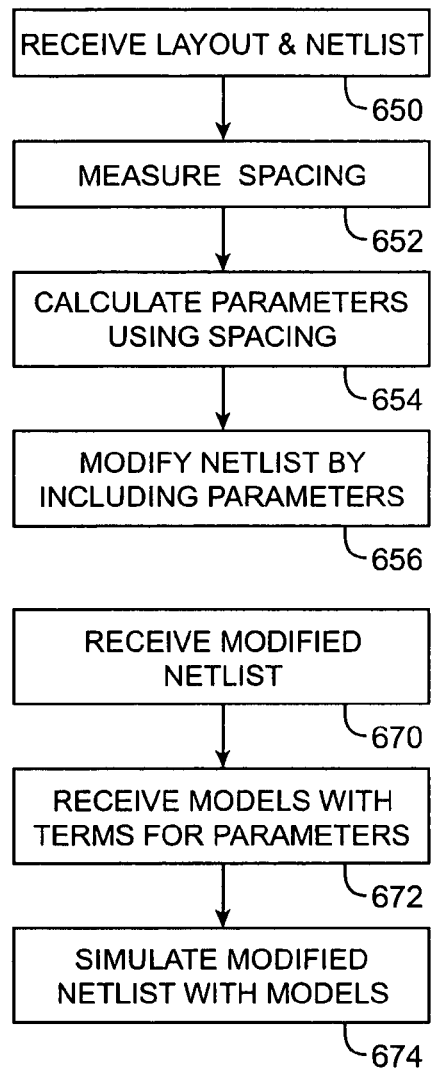
FIG. 6A                    FIG. 6B

M1  N2 G1 N1  B NCH  W=Wdr  L=Ldr  DLPDGLE=*DL1*
M2  N3 G1 N2  B NCH  W=Wdr  L=Ldr  DLPDGLE=*DL2*
M3  N4 G1 N3  B NCH  W=Wdr  L=Ldr  DLPDGLE=*DL3*
M4  N6 G2 N5  B NCH  W=Wdr  L=Ldr  DLPDGLE=*DL4*

METHOD FOR INCORPORATING PATTERN DEPENDENT EFFECTS IN CIRCUIT SIMULATIONS

BACKGROUND

The present invention relates to improving the accuracy of simulations that are used to predict the electrical behavior of integrated circuits.

Simulations are used by engineers to predict the expected electrical behavior of electronic circuits and systems, such as integrated circuits. In the example of integrated circuits, a circuit description such as a netlist of an integrated circuit, or more likely, an integrated circuit portion, is input as a database to a simulator. The simulator accesses a library of models and substitutes the models for devices in the netlist. The simulator also receives a number input signals or vectors from an engineer, software generator, or other source. The simulator program then predicts the expected response of the integrated circuit or portion to the input vectors.

Many errors can reduce the accuracy of these models and thereby reduce the accuracy of simulation results. One group of errors may be referred to as pattern dependent effects. These effects can be quite noticeable, particularly on the gate length of a MOSFET device or emitter of a bipolar transistor.

The location of a gate of a MOSFET device relative to other gates on an integrated circuit layout can influence its length after device manufacturing. For example, the geometries of these devices have become so small that they are approaching the wavelength of the light used to expose resist that is used to define the pattern of layers, such as polysilicon gates, on an integrated circuit during its manufacturing. This and related phenomena are referred to as optical proximity effects. Also, after exposed resist is removed, the etch used to remove unprotected polysilicon etches differently in larger areas of unprotected polysilicon than it does in tighter quarters—this is referred to as etch bias. These effects can be somewhat predicted and countered when integrated circuit masks are made by using an optical correction algorithm, though residual errors continue to exist.

Conventional solutions that reduce these effects include, depending on circumstances, using so called matching "dummies," making devices larger, and complicated layout methods such as quad connections. Each of these increase the size of a layout of a circuit and consume valuable die real estate.

If the above effects could be modeled accurately, the use of these techniques could be limited to instances where it is shown by simulation to be sufficiently important. Accordingly, what is needed are methods, software, and apparatus to more accurately simulate an integrated circuit or integrated circuit portion by including these pattern dependent effects.

SUMMARY

Accordingly, embodiments of the present invention provide methods, software, and apparatus for providing a netlist that includes one or more parameters that are determined by one or more pattern dependent effects. The netlist including the parameters is simulated, resulting in a more accurate simulation result.

One particular embodiment of the present invention receives the layout of a circuit including one or more MOSFET transistors. For one or more of the MOSFET transistors, the spacing between that transistor and adjacent transistors is measured using the received layout. From this spacing, a pattern dependent parameter is determined. A netlist of the circuit is extracted and this parameter is passed to a circuit simulation tool as part of the extracted netlist.

In this particular embodiment, the parameter modifies the length of the gate that is used in simulation. A simulation is then run on the extracted netlist that includes this parameter. The result of the simulation is more accurate since pattern dependent effects have been included.

In other embodiments, other pattern dependent effects, such as layer density, planarization effects, and others, can be used to determine the values of one or more parameters. These parameters may be used to modify gate length, emitter size, resistor width, or other device characteristics. Various embodiments of the present invention may include one or more of these or the other features described herein.

A better understanding of the nature and advantages of the present invention may be gained with reference to the following detailed description and the accompanying drawings.

BRIEF DESCRIPTION OF THE DRAWINGS

FIG. 4A is a schematic for the circuitry shown in the exemplary layout of FIG. 3, while FIG. 4B is its netlist;

FIGS. 6A and 6B are flowcharts illustrating a method of including proximity effects in circuit simulations according to an embodiment of the present invention;

FIG. 10A is a schematic of the circuitry in the layout of FIG. 3 with optical proximity effects included; while FIG. 10B is a modified netlist of this circuitry.

DESCRIPTION OF EXEMPLARY EMBODIMENTS

Figure 1:
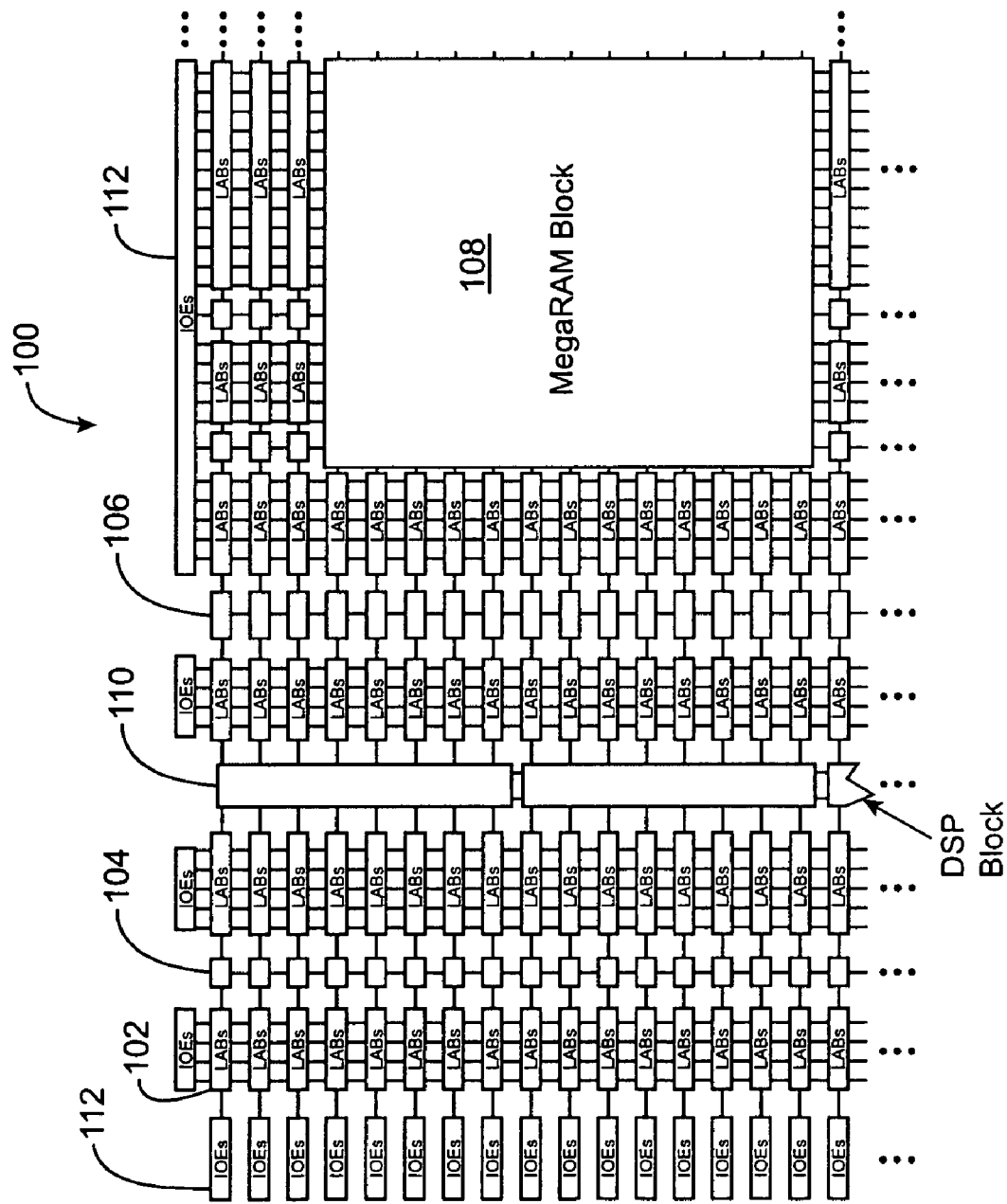
FIG. 1 is a simplified block diagram of a programmable logic device, the circuits of which may be more accurately simulated by embodiments of the present invention.

FIG. 1 is a simplified partial block diagram of an exemplary high-density programmable logic device 100. This circuit, or portions of this circuit, may be more accurately modeled using embodiments of the present invention.

PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be used to improve the accuracy of simulations of different types of PLDs, FPGAs, and the other types of digital integrated circuits.

Figure 2:
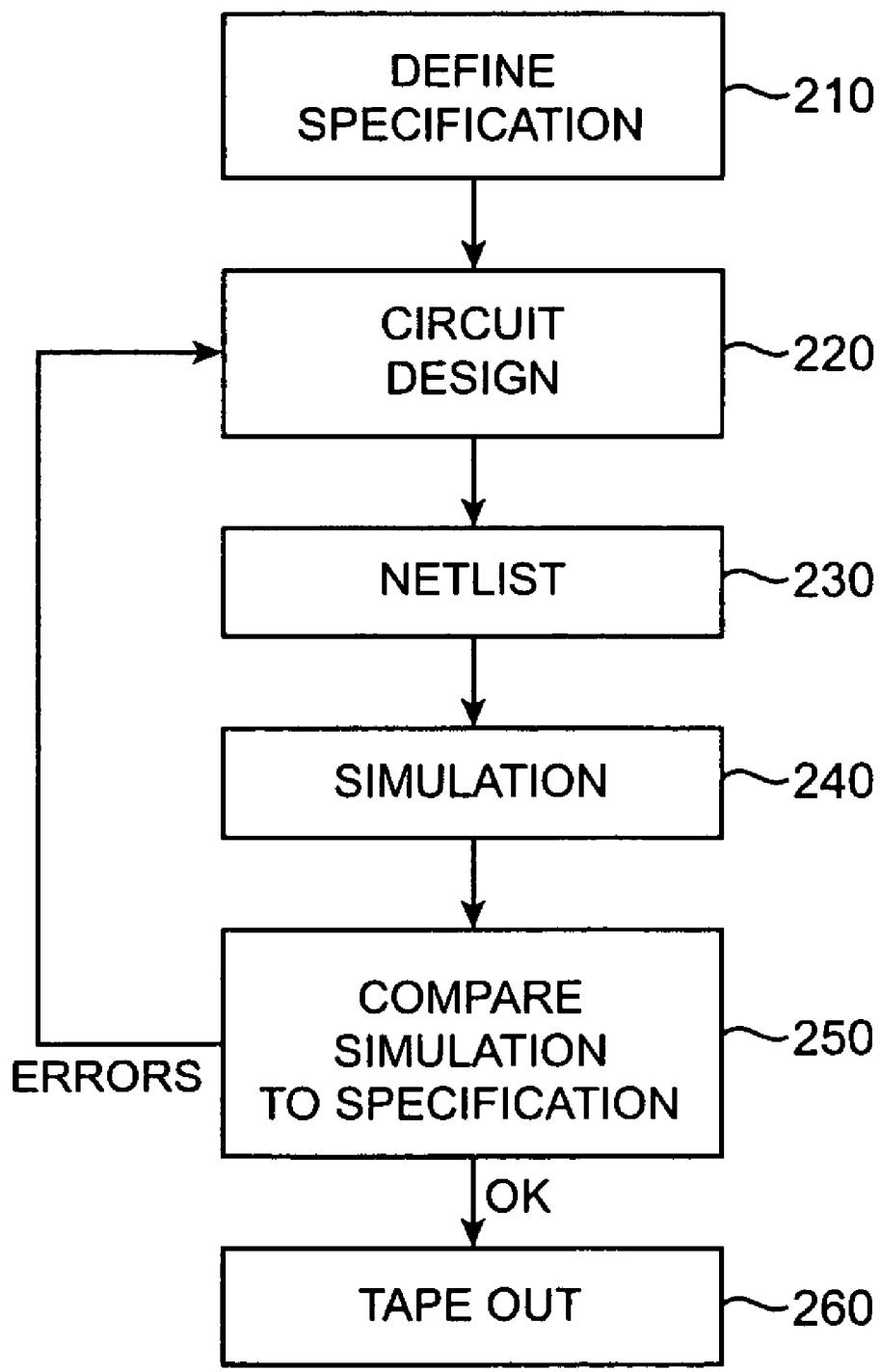
FIG. 2 is a flowchart illustrating a method of developing an integrated circuit that may be improved by embodiments of the present invention.

FIG. 2 is a flowchart illustrating a method of developing an integrated circuit that may be improved by embodiments of the present invention. In act 210, a product specification or description for an integrated circuit or portion of an integrated circuit is developed. The circuit is designed in act 220. Typically a set of schematics, equations, or combination thereof is generated at this point. A netlist is extracted or generated from the design schematics and equations in act 230.

This netlist is simulated in act 240. Typically, models from a model library are substituted for symbols in the schematics and terms in the equations. The models include a number of equations. One or more inputs or vectors representing input signals and voltage supplies are provided to the simulator. The simulator provides an output that shows the expected electrical behavior of the integrated circuit or integrated circuit portion given the input vectors.

The simulation results can then be compared in act 250 to the target specification provided in act 210. If the results are acceptable, the device can be manufactured. If not, the design is modified.

Once the integrated circuit is manufactured, its performance will be compared to the target specification. If there is a difference between the expected simulated behavior and actual integrated circuit performance, there will likely be errors in actual performance as compared to the desired specification of act 210. It is therefore desirable that the simulator used in act 240 provide results that accurately portray integrated circuit behavior.

Figure 3:
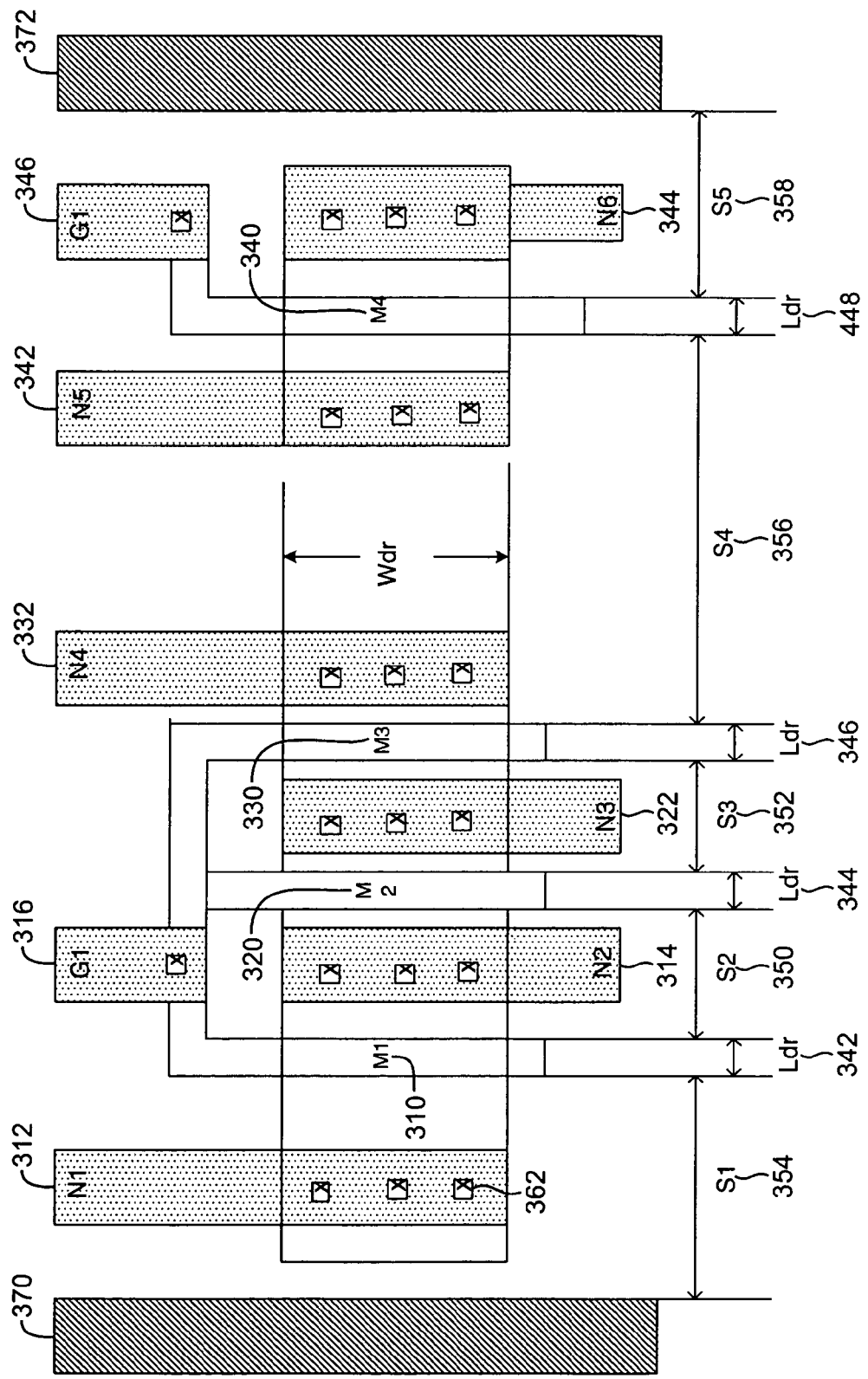
FIG. 3 illustrates an exemplary layout that may be modeled and simulated more accurately by methods and apparatus incorporating embodiments of the present invention.

FIG. 3 illustrates an exemplary layout of a portion of an integrated circuit that may be modeled and simulated more accurately by methods and apparatus incorporating embodiments of the present invention. This figure, as with all the included figures, is shown for illustrative purposes only, and does not limit either the possible embodiments of the present invention or the claims.

This figure includes transistors M1 310, M2 320, M3 330, and M4 340, as well as polysilicon interconnect or dummy stripes 370 and 372. Each of these four transistors have the same drawn length, Ldr, and width, Wdr. These transistors, however, are separated from each other and from the polysilicon stripes 370 and 372 by varying distances. For example, M1 310 is displaced from polysilicon stripe 370 by a distance S1 354. Transistor M2 320 is displaced from transistor M1 310 by a distance S2 350. Transistor M3 is displaced from transistor M2 320 by a distance S3 352. Similarly, transistor M4 340 is displaced from transistor M3 330 by a distance S4 356, and from the polysilicon stripe 372 by a distance S5 358.

Because these four transistors are separated by these different distances, even though the drawn lengths of the four transistors are the same, after manufacturing is complete, the actual lengths of the transistors will vary. This is particularly important if the devices need to match. For example, M4 340 may need to be one-third the cumulative size of M1 310, M2 320, and M3 330 in a 3:1 current mirror. Any mismatch in device size between these devices may result in an error in current provided by the 3:1 current mirror.

The reasons for this are referred to as pattern dependent effects. These pattern dependent effects include not only the distances as mentioned above, but the density of a particular layout feature, the circuit topography, and other factors.

Features on an integrated circuit, such as the polysilicon gates of the illustrated transistors, are manufactured using photolithography techniques. For example, a polysilicon layer may be deposited or grown across the integrated circuit. A layer of resist is then placed over the polysilicon layer. A mask having features such as the gates of transistors printed on it is then aligned to the integrated circuit. Light is then passed through the mask exposing unprotected resist. The exposed resist is then removed. (Note that for one type of resist, the resist exposed to light (that is, the resist not protected by the printed mask pattern) is removed, leaving the unexposed resist to protect the polysilicon gates. For other types of resists, the resist exposed to light is not removed, and the exposed resist protects the gates from being etched.)

The size of the features shown in layouts such as this figure have become incredibly small in modern integrated circuit processing. For example, line widths less then 0.10 microns have become common. This is very near the wavelength of the light used to expose the resist. Accordingly, the space between these features modify the way in which light exposes resist. This change as a function of spacing is referred to as the optical proximity effect.

Also, once the exposed resist is removed, the unprotected polysilicon etches at a different rate depending on how large an area of polysilicon is unprotected by remaining resist. Specifically, a large area of unprotected polysilicon tends to etch at a slower rate, while a smaller area tends to etch faster. For this reason, the polysilicon gate of the transistors on the outside of a number of devices, such as M4 340, tend to etch larger than the polysilicon gates of the transistors on the inside, such as M2 320. This difference in gate size means the outside transistors tend to switch at a lower maximum frequency, while the inside transistors tend to be faster and have higher leakage currents.

One method of correcting for these effects is to modify the layout shown in FIG. 3 using an optical correction algorithm. However, these algorithms have their limitations, and cannot correct sizes to a greater resolution than the grid size that the circuit uses. This means that at least a minor quantization error remains after correction.

Design engineers have developed various techniques to compensate for these pattern dependent effects. These include using dummy devices, such that the distance between each transistor is the same. Also, devices may be divided into multiple stripes and layed out in interdigitated or quad-connected type configurations. Also, the devices may be made larger, such that small variations in their lengths can be ignored. Each of these techniques increases the die size needed for the circuitry of FIG. 3. Thus, it is desirable to only use these techniques where needed. Accordingly, embodiments of the present invention provide methods, apparatus, and software that simulate these effects more accurately. The simulation results can then be compared to a desired result. From this comparison, the circuitry can be changed, the sizes of some transistors can be altered, or other matching and layout techniques like the ones described above can be used.

In this particular example, the pattern dependent effect described is based on the spacing between the transistors. Other pattern dependent effects, such as feature density, in this example polysilicon density, can be included in simulations according to embodiments of the present invention.

Also, while the length of the transistors as defined by the polysilicon stripes is described in this example, the pattern dependent effects of other features and device characteristics can be modeled and simulated according to embodiments of the present invention. While CMOS devices are illustrated here, other devices are sensitive to these pattern dependent effects and may be modeled and simulated according to embodiments of the present invention. For example, the widths of resistors and the sizes of bipolar emitters may be more accurately modeled.

Figures 4A, 4B:
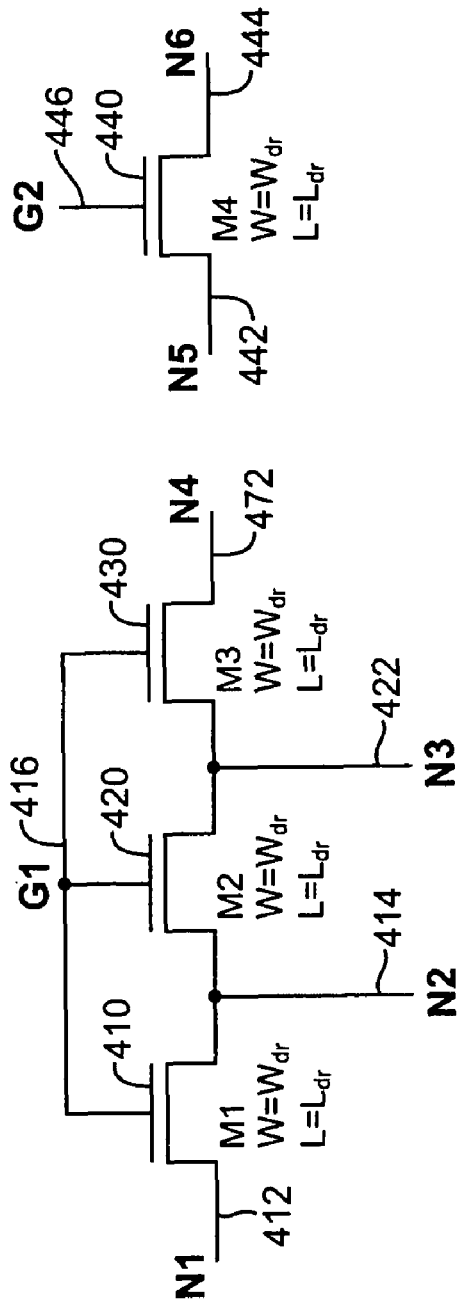

FIG. 4A is a schematic for the circuitry shown in the exemplary layout of FIG. 3. The schematic includes transistors M1 410, M2 420, M3 430, and M4 440. The polysilicon dummy stripes are typically not included in a schematic, unless they are formed as an inactive device, for example a device with one or more terminals connected to a supply rail such that the device is disconnected from the circuit.

Each of the transistors is shown as having a number of attributes, including device name, device width, and device length. From this schematic, it is not apparent that the lengths of these devices may vary in a final integrated circuit product, and in fact, they are assumed to each be identical.

FIG. 4B is a netlist of this circuitry. The netlist includes the connections, type, width and length for each transistor. For example M1 450 has a drain connected to N2, a gate connected to G1, a source connected to N1, and a bulk or well connection tied to B (not shown on the schematic of 4A). Transistor M1 is an n-channel device, and has a width Ldr, and a length Wdr. Conventionally, the length of each of these devices will be simulated as being identical. If the lengths of the these transistors on a final integrated circuit vary, actual circuit performance will deviate from simulation results. If Ldr is adjusted taking pattern dependent effects into account, the simulation is more accurate.

Figure 5:
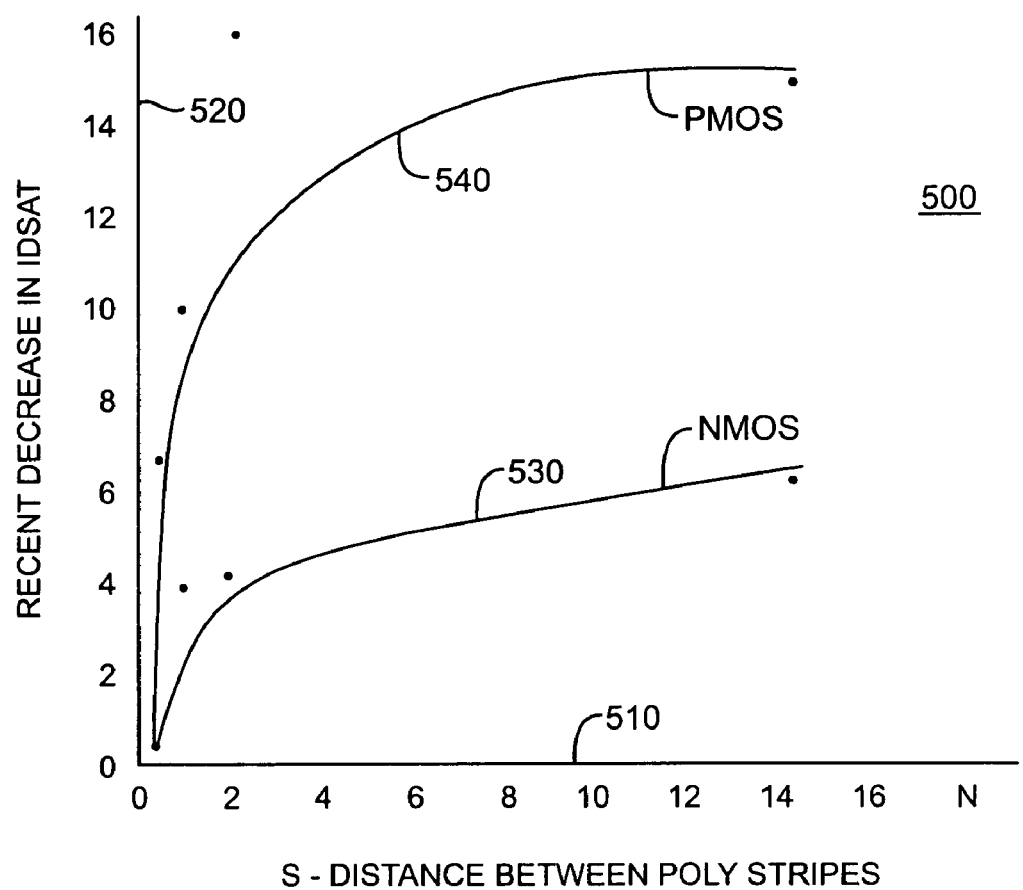
FIG. 5 is an exemplary plot showing a decrease in IDSAT for NMOS and PMOS transistors as a function of transistor spacing.

FIG. 5 is an exemplary graph showing a decrease in IDSAT for NMOS and PMOS transistors as a function of transistor spacing. Change in transistor IDSAT is plotted along a Y-axis 520 as a function of distance between polysilicon transistor stripes along an X-axis 510.

As can be seen, the change in IDSAT for PMOS device 540 is larger, at least in one exemplary process, than for NMOS device 530. Also, small changes in distance between polysilicon gates can cause a large change in the device length. As distance increases, any further change has a reduced effect.

FIG. 6A is a flowchart illustrating a method of including proximity effects in a circuit simulation according to an embodiment of the present invention. In act 610, a layout is received. This layout may be a layout of an integrated circuit or an integrated circuit portion. In act 612, a number of spacings are measured, for example the distance between polysilicon transistor gates, though other measurements may be made. In act 614, one or more parameters are calculated using the spacing information. A netlist is extracted in act 618. The extracted netlist includes the parameters calculated above. In the example of a polysilicon gate length, these parameters may change the device length directly, or be passed as a parameter to be used by the transistor models. These transistor models include equations that have terms for the parameters, and the parameters change the values of the resulting equations to reflect pattern dependent effects on the transistor.

These first acts may be performed as part of another netlist extraction program, such as a layout parameter extraction (LPE) program. The netlist may then be provided to a second program or be used as part of a program that performs the other acts in FIG. 6A. The second program may be a simulation program, such as HSPICE, StarSim, or ASPICE, a proprietary simulation tool developed by Altera Corporation, of San Jose, Calif.

In act 630, the extracted netlist is received, though if one program performs each of these tasks, this act is not necessary. In act 632, models are received from a database such as a model library. Again, these models typically include equations having terms for the parameters calculated above, though again the parameters may be used to directly change device characteristics such as length. The extracted netlist is then simulated with these models in acts 634.

FIG. 6B is a flowchart illustrating another method of including proximity effects in a circuit simulation according to an embodiment of the present invention. In the acts of FIG. 6A, the netlist is extracted from the layout. In the acts of FIG. 6B, a netlist is received and modified by information measured on the layout.

In act 650, a layout and a netlist are received. In act 652, measurements are made of spacing between devices on the layout. In act 654, parameters are calculated using the measured spacing information. The netlist is modified by including these parameters in act 656.

Again, this modified netlist is received, in act 670, as are models from a library, in act 672. The modified netlist is then simulated with these models, in act 674.

Figure 7:
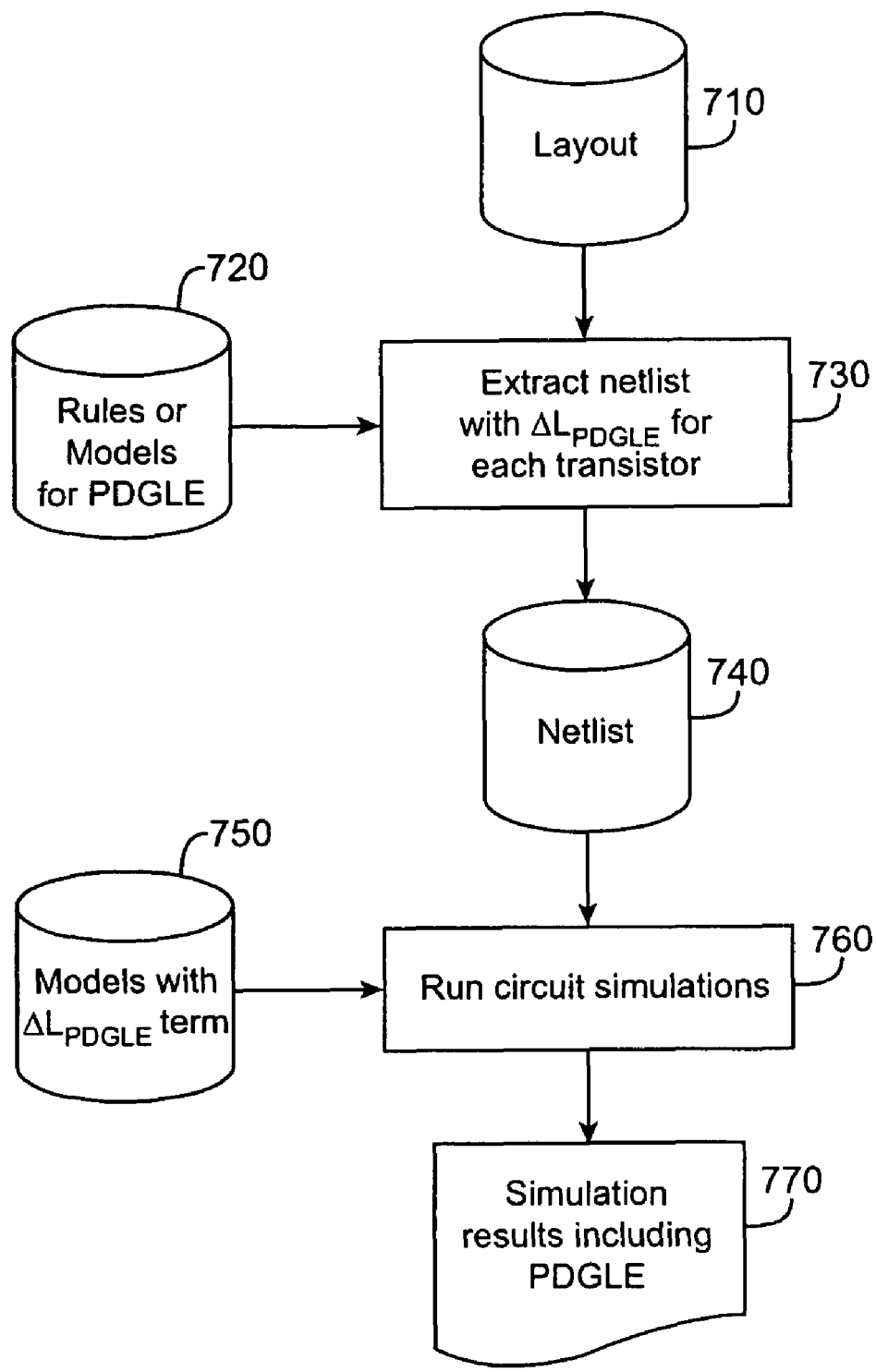
FIG. 7 is a flow diagram illustrating a method of including proximity effects in circuit simulations according to an embodiment of the present invention.

FIG. 7 is a flowchart illustrating a method of including proximity effects in a circuit simulation according to an embodiment of the present invention. A netlist extraction program 730 receives a layout 710 and rules or models 720 for accounting for pattern dependent effects, and generates a netlist 740. The netlist 740 may include one or more parameters that account for changes in gate length and other dimensions due to pattern dependent effects.

A circuit simulation program 760 receives the netlist 740 and models 750, and generates simulation results 770.

Again, at the location of manufacture of the masks, commonly referred to as a "mask shop," an optical proximity correction algorithm is run to alter the geometries on the mask to compensate for the above pattern dependent effects. If this is done, these pattern dependent effects should be taken into account before measurements are taken and parameters calculated. Alternately, this step can be shut off or not performed at the mask shop.

Figure 8A:
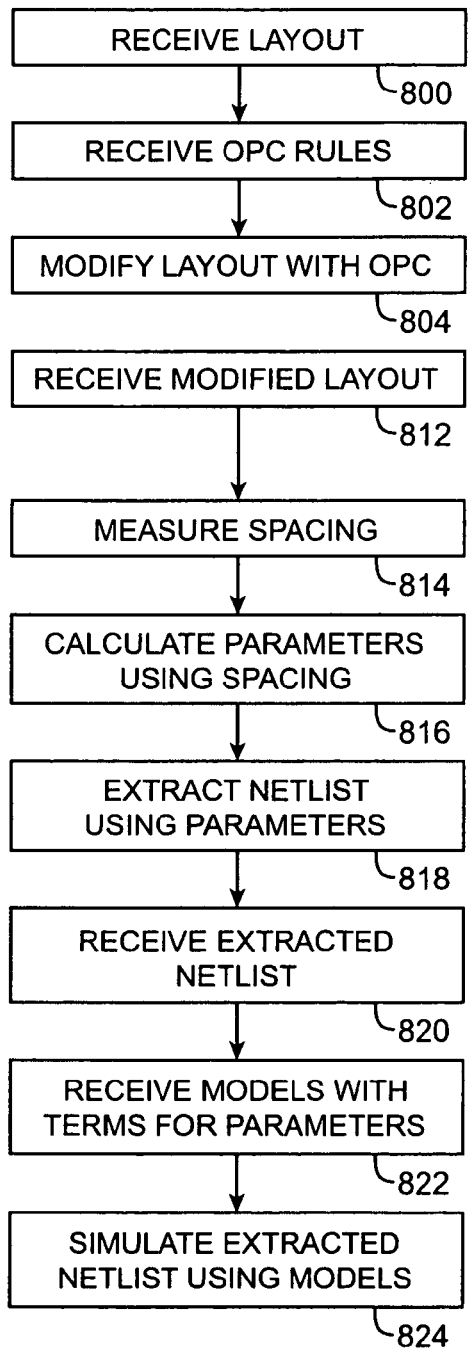
FIGS. 8A and 8B are flowcharts illustrating a method of including optical proximity correction as well as optical proximity effects in a circuit simulation according to an embodiment of the present invention.

FIG. 8A is a flowchart illustrating a method of including optical proximity correction as well as optical proximity effects in a circuit simulation according to an embodiment of the present invention. This flow presumes that the resulting masks will undergo a correction using an optical proximity correction algorithm.

In act 800, a layout is received. The optical proximity correction algorithm rules are received in act 802, and the layout is modified in act 804.

As before, these initial steps may be performed by a separate piece of software, or a piece of software that performs further tasks. If a separate piece of software is used, the modified layout is received in act 812. Spacing is measured on the modified layout in act 814, and parameters are calculated using the spacing information, in act 816. A netlist is extracted using these parameters, in act 818. Again, if separate simulation software is used, the extracted netlist is received in act 820, and models are received from a library, in act 822. The extracted netlist is simulated using these models, in act 824.

Again, in this example, spacing is measured and parameters are calculated using that spacing information, though other pattern dependent features, such as density and topology, may be used in determining some or all of these parameters.

Figure 8B:
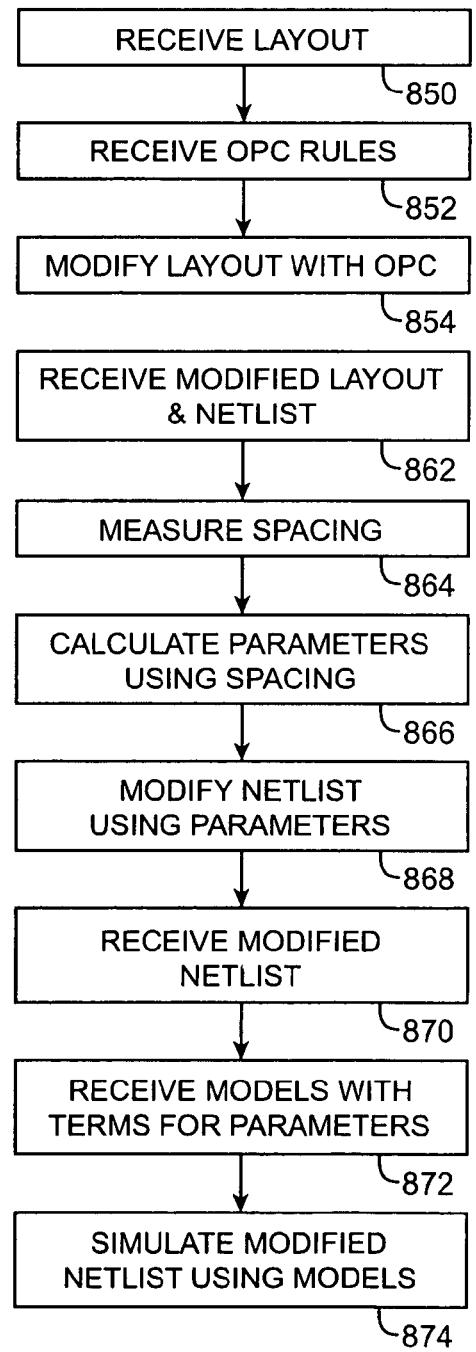

FIG. 8B is a flowchart illustrating another method of including optical proximity correction as well as optical proximity effects in a circuit simulation according to an embodiment of the present invention. As before, in the flow of FIG. 8A, a netlist is extracted from a layout, while in FIG. 8B, a netlist is received and modified by information extracted from a layout.

In act 850, a layout is received, optical correction algorithm rules are applied in 852, and a modified layout is generated in act 854. The modified layout and netlist are received in act 862. In act 864, spacing measurements are taken, and these are used to calculate parameters in act 866. In act 868, the netlist is modified using these parameters.

In act 870, the modified netlist is received, and models are received in act 872. The modified netlist is simulated using these models in act 874.

Figure 9:
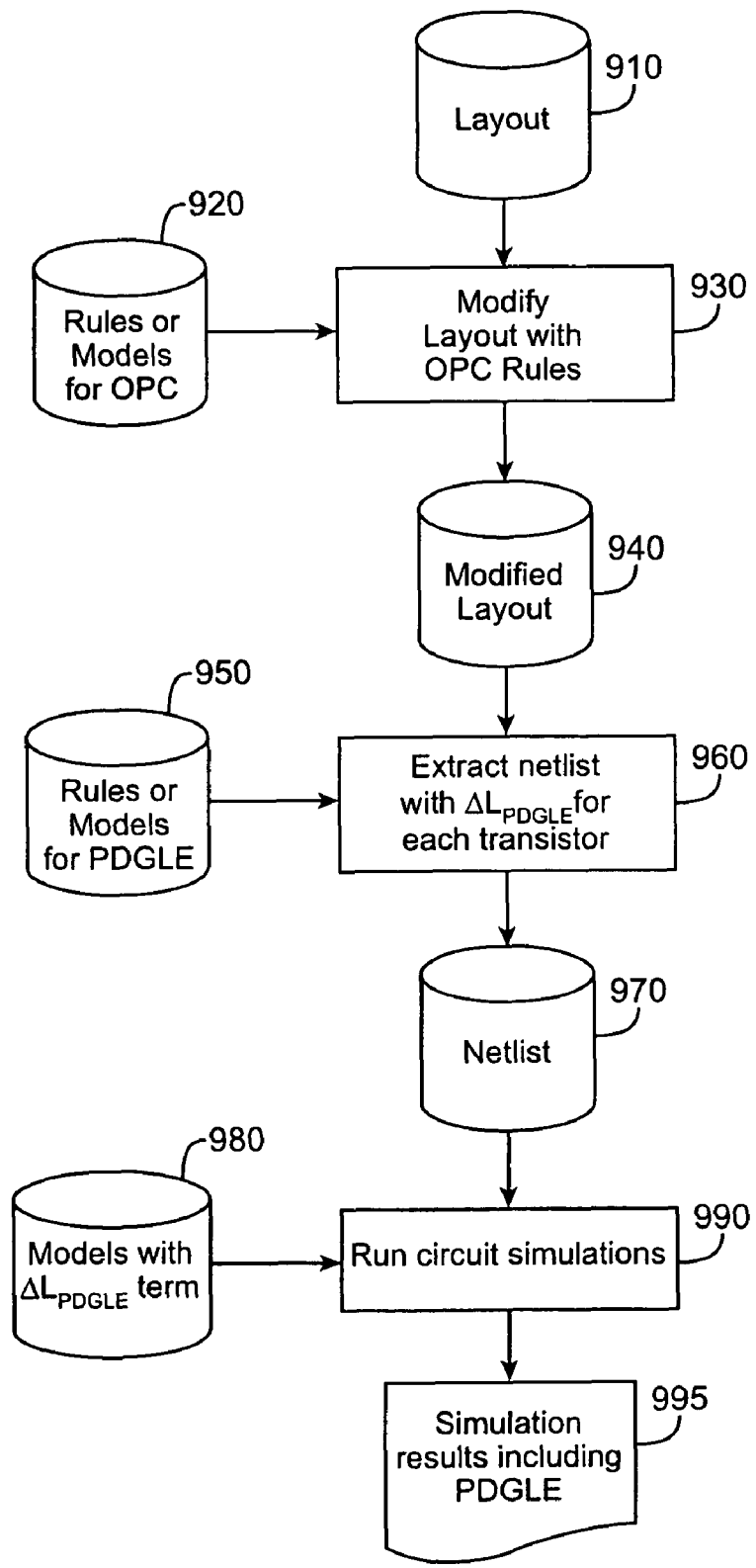
FIG. 9 is a flow diagram illustrating a method of including optical proximity correction as well as optical proximity effects in a circuit simulation according to an embodiment of the present invention.

FIG. 9 is a flow diagram illustrating a method of including optical proximity correction as well as optical proximity effects in a circuit simulation according to an embodiment of the present invention. An optical proximity correction software program 930 receives a layout 910 and rules or models 920, and generates a modified layout 940. This layout 940 is modified to account for the optical proximity correction algorithm that will be used later on the final masks at a mask shop.

A netlist extraction software program 970 receives the modified layout 940, and rules or models 950 for accounting for pattern dependent effects, and generates a netlist 970. A circuit simulator 990 receives the netlist 970 and models 980 and generates a simulation result 995.

Figures 10A, 10B:
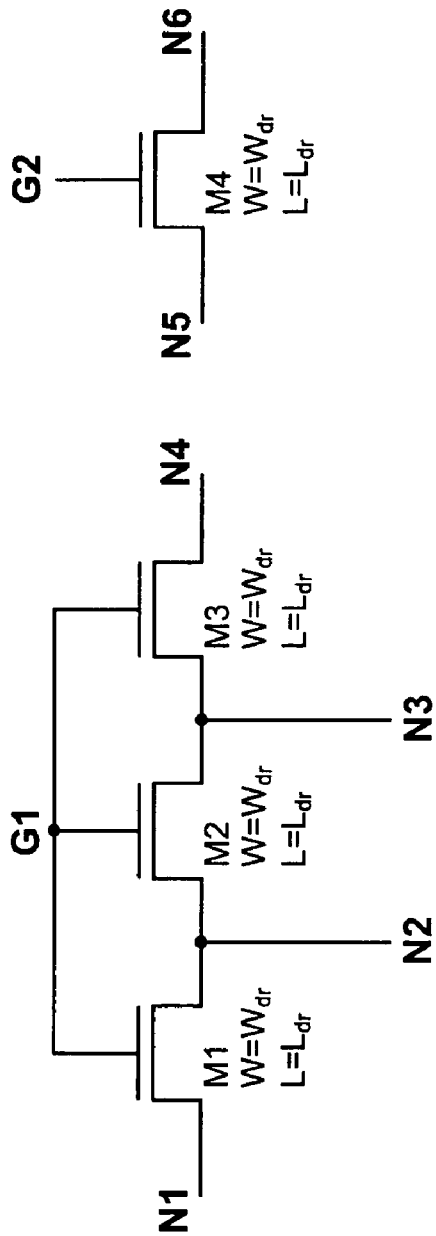

FIG. 10A is a schematic of the circuitry in the layout of FIG. 3 with optical proximity effects included; while FIG. 10B is a modified netlist of this circuitry. The transistors listed in the netlist of FIG. 10B include an extra term, DLPDGLE, which is a term that accounts for the change in length of the transistor due to pattern dependent effects, such as transistor gate spacing. These terms have parameter values, DL1 through DL4, in this example, that reflect the relative change in gate length. While in this example, these parameters are separate attributes, they may be used to modify the value of the length of the transistor Ldr directly.

A specific embodiment of the present invention uses a modified BSIM4 model to model CMOS devices. The standard BSIM4 model has equations for the effective channel length, Leff, used in current/voltage and capacitor/voltage modeling that are:

$$L_{eff} = L - 2[LINT + LL/L^{LLN} + LW/W^{LWN} + LWL/(L^{LLN} W^{LWN})] \text{ and}$$

$$L_{eff,CV} = L - 2[DLC + LLC/L^{LLN} + LWC/W^{LWN} + LWLC/(L^{LLN} W^{LWN})]$$

where $$L = L_{drawn} + XL$$

and where $L_{drawn}$ is the drawn gate length, XL is the difference between the drawn gate length and the layout target, LINT and DLC reflect the difference between the gate and channel length, that is, they are length offset fitting parameters, and the remaining terms account for variation in length as a function of device geometry.

According to an embodiment of the present invention, the local environment, for example, transistor spacing, is used to calculate a parameter DLPDGLE, where DLPDGLE is the change in gate length due to pattern dependent effects. The modified BSIM4 equations include terms that use this parameter:

$$L_{eff} = L - 2[LINT + LL/L^{LLN} + LW/W^{LWN} + LWL/(L^{LLN} W^{LWN})] + DLPDGLE \text{ and}$$

$$L_{eff,CV} = L - 2[DLC + LLC/L^{LLN} + LWC/W^{LWN} + LWLC/(L^{LLN} W^{LWN})] + DLPDGLE$$

where $$L = L_{drawn} + XL.$$

In other embodiments, other parameters may be used, and other equations may be modified to include terms that make use of them. Also, in other embodiments, other models besides BSIM4 models may be used. For example, in the future, other models will be developed, and these models may include or be modified to include terms that make use of pattern dependent effect parameters.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of simulating the expected behavior of a portion of an integrated circuit comprising:
   receiving a layout of the portion of the integrated circuit, wherein the layout describes a first device and a second device from the integrated circuit;
   measuring a first distance between the first device and the second device;
   extracting a netlist, wherein the netlist includes a parameter calculated based on the first distance;
   adjusting a length of a gate of the first device based on the parameter; and
   determining a characteristic of the integrated circuit based on the adjusted length.

2. The method of claim 1 further comprising:
   before measuring the first distance, modifying the first distance by using an optical correction algorithm.

3. The method of claim 1 further comprising:
   receiving a model for the first device, wherein the model includes a term for the parameter; and
   simulating the extracted netlist using the model.

4. The method of claim 3 wherein the first device and the second device are both transistors.

5. The method of claim 3 wherein the first device and the second device are both resistors.

6. The method of claim 3 wherein the first device and the second device are both transistors and the first distance is a distance between a poly gate of the first device and a poly gate of the second device.

7. The method of claim 3 wherein the integrated circuit includes a third device, the method further comprising:
   measuring a second distance between the first device and the third device; and
   calculating the parameter using the first distance and the second distance.

8. The method of claim 1 wherein the first device is adjacent to the second device.

9. The method of claim 1 further comprising:
before measuring the first distance, modifying the length of the gate of the first device using an optical correction algorithm.

10. A method of simulating the expected behavior of a portion of an integrated circuit comprising:
receiving a netlist of the portion of the integrated circuit, wherein the netlist describes a first device and a second device from the integrated circuit;
receiving a layout of the portion of the integrated ciruit including the first device and the second device;
measuring a first distance between the first device and the second device on the received layout;
calculating a parameter based on the first distance, wherein the parameter is used to adjust a length of a gate of the first device;
adjusting the length of the gate of the first device based on the parameter;
modifying the netlist by including the parameter; and
determining a characteristic of the integrated circuit based on the adjusted length.

11. The method of claim 10 further comprising:
before measuring the first distance, modifying the first distance by using an optical correction algorithm.

12. The method of claim 10 further comprising:
receiving a model for the first device, wherein the model includes a term for the parameter; and
simulating the modified netlist using the model.

13. The method of claim 12 wherein the first device and the second device are both resistors.

14. The method of claim 12 wherein the first device and the second device are both transistors and the first distance is a distance between a poly gate of the first device and a poly gate of the second device.

15. The method of claim 12 wherein the netlist and layout include a third device, the third device adjacent to the first device, the method further comprising:
measuring a second distance between the first device and the third device; and
calculating the parameter using the first distance and the second distance.

16. The method of claim 12 wherein the first device and the second device are both transistors.

17. The method of claim 10 wherein the first device is adjacent to the second device.

18. The method of claim 10 further comprising:
before measuring the first distance, modifying the length of the gate of the first device using an optical correction algorithm.

19. A computer system comprising a non-transitory computer readable media storing code executable by the computer system, the code including:
code for receiving a layout of a portion of an integrated circuit, wherein the layout describes a plurality of devices;
a first database for storing the layout;
code for measuring distances between devices on the layout;
code for calculating one or more parameters based on the measured distances;
code for extracting a netlist from the layout, the netlist including the one or more parameters;
code for adjusting a plurality of gate lengths of devices in the netlist based on the one or more parameters; and
code for determining a characteristic of the integrated circuit based on the adjusted plurality of gate lengths.

20. The computer system of claim 19 further including:
a second database for storing the extracted netlist;
code for receiving a plurality of models, the models having terms for the one or more parameters;
a third database for storing the models;
code for simulating the extracted netlist using the models; and
code for outputting a result of the simulation.

21. The computer system of claim 20 further comprising:
code for generating a plurality of input vectors, wherein the input vectors are used in simulating the extracted netlist.

22. The computer system of claim 20 further including:
code for receiving a plurality of input vectors, wherein the input vectors are used in simulating the extracted netlist.

23. The computer system of claim 20 further comprising:
code for modifying dimensions on the layout by performing an optical correction algorithm.

24. The computer system of claim 20 further comprising:
code for extracting values and electrical connections of parasitic devices on the layout and providing them in the extracted netlist.

25. A method of simulating the expected behavior of a portion of an integrated circuit comprising:
receiving a layout of the portion of the integrated circuit, wherein the layout describes a first transistor gate and a second transistor gate from the integrated circuit, and wherein the first transistor gate has a first drawn length;
measuring a first distance between the first transistor gate and the second transistor gate;
determining, based on the first distance, an expected difference between the first drawn length and a length of the first transistor gate after manufacturing;
simulating the portion of the integrated circuit using a netlist, wherein the netlist includes the expected difference; and
generating a simulation result output.

26. The method of claim 25 wherein the netlist is extracted from the layout.

27. The method of claim 25 wherein the netlist is modified before the simulation using the expected difference.

28. The method of claim 25 further comprising:
before measuring the first distance, modifying the first drawn length using an optical correction algorithm.

29. The method of claim 25 wherein the integrated circuit includes a third transistor gate, the method further comprising:
measuring a second distance between the first transistor gate and the third transistor gate; and
calculating the expected difference using the first distance and the second distance.

30. The method of claim 25 wherein the first transistor gate is adjacent to the second transistor gate.

* * * * *